United States Patent
Glenn

(10) Patent No.: US 6,429,515 B1
(45) Date of Patent: Aug. 6, 2002

(54) LONG WIRE IC PACKAGE

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/565,881

(22) Filed: May 5, 2000

(51) Int. Cl.⁷ .......................... H01L 29/40; H01L 23/28
(52) U.S. Cl. ...................... 257/734; 257/787; 257/786; 257/784
(58) Field of Search ................................. 257/786, 780, 257/781, 782, 784, 787; 438/612, 614, 106, 121, 666

(56) References Cited

U.S. PATENT DOCUMENTS

| | | | |
|---|---|---|---|
| 4,953,007 A | | 8/1990 | Erdos ........................... 357/84 |
| 4,975,761 A | | 12/1990 | Chu ............................. 357/72 |
| 5,168,368 A | | 12/1992 | Gow, III et al. ............. 257/666 |
| 5,208,188 A | | 5/1993 | Newman ...................... 437/220 |
| 5,430,331 A | | 7/1995 | Hamzehdoost et al. ..... 257/796 |
| 5,705,851 A | * | 1/1998 | Mostafazadeh et al. ..... 257/675 |
| 5,717,252 A | * | 2/1998 | Nakashima et al. ......... 257/707 |
| 5,741,729 A | * | 4/1998 | Selna ........................... 438/125 |
| 5,753,970 A | | 5/1998 | Rostoker ...................... 257/668 |
| 6,011,694 A | * | 1/2000 | Hirakawa .................... 361/774 |
| 6,017,877 A | * | 1/2000 | Degani et al. ............... 174/261 |
| 6,157,085 A | * | 12/2000 | Terashima ................... 257/783 |
| 6,232,561 B1 | * | 5/2001 | Schmidt et al. ............. 257/676 |

FOREIGN PATENT DOCUMENTS

JP        61-237459        10/1986

* cited by examiner

*Primary Examiner*—Jasmine J B Clark
(74) *Attorney, Agent, or Firm*—Gunnison, McKay & Hodgson, L.L.P.; Serge J. Hodgson

(57) ABSTRACT

An encapsulated integrated circuit package includes a large number of traces spaced a significant distance from the integrated circuit. Bond pads of the integrated circuit are electrically connected to corresponding traces by corresponding long wires. Since the long wires are intermediately bonded to intermediate bonding pads between the integrated circuit and the traces and extend along the surface of the substrate, the long wires are not susceptible to wire sweep during the encapsulation process used to form the package body.

20 Claims, 5 Drawing Sheets

LONG WIRE IC PACKAGE

This application is related to Glenn, co-filed and commonly assigned U.S. patent application Ser. No. 09/566,849 entitled "LONG WIRE IC PACKAGE FABRICATION METHOD", which is herein incorporated by reference in its entirety.

BACKGROUND OF THE INVENTION

1. Field of the Invention

The present invention relates generally to the packaging of electronic components. More particularly, the present invention relates to an integrated circuit package.

2. Description of the Related Art

Trends in modern integrated circuitry are generally towards smaller size and higher density. This has resulted in the requirement to fit a large number of bond pads (I/O pads) in a relatively small area of the integrated circuit, sometimes called the semiconductor chip.

To route electrical signals to and from the integrated circuit, the bond pads of the integrated circuit were electrically connected to traces on a substrate. However, since the traces were generally larger in size and pitch, i.e., spacing, than the bond pads, the number of traces which could be formed directly adjacent to the integrated circuit was limited.

One technique for overcoming the size and pitch limitations of the traces was to form the traces at a significant distance from the integrated circuit. However, this caused the length of the bond wires extending between the bond pads of the integrated circuit and the corresponding traces to be relatively long. Long bond wires were particularly problematic during the subsequent plastic encapsulation transfer molding process where the integrated circuit, the bond wires, and the substrate were transfer molded into a plastic encapsulate to form the finished integrated circuit package.

More particularly, during the plastic encapsulation transfer molding process, the plastic encapsulate was caused to flow around the integrated circuit, the bond wires, and substrate. This flow of plastic encapsulate against the bond wires caused: (1) the bond wires to become disconnected from the bond pads of the integrated circuit or from the traces; (2) caused the bond wires to break; and/or (3) caused the bond wires to move and short one another. This phenomena is called "wire sweep".

In the event a plastic encapsulation injection molding process was used, wire sweep was even more problematic. Generally, the plastic encapsulate was injected around the integrated circuit, the bond wires and the substrate at a higher pressure in a plastic encapsulation injection molding process than in a plastic encapsulation transfer molding process. Due to this higher pressure, more force was exerted against the bond wires, which were susceptible to wire sweep.

To avoid wire sweep, the bond wires were supported by an intermediate section between the bond pads of the integrated circuit and the traces.

Rostoker, U.S. Pat. No. 5,753,970, which is herein incorporated by reference in its entirety, teaches a lead support structure which supported a bond wire at a point along its length such that the bond wire was mechanically constrained and could not short to adjacent bond wires (see lead support structures 700a, 700b, 700c of FIGS. 9a, 9b, 9c, respectively, of Rostoker). However, providing and attaching such a lead support structure to the substrate was relatively labor-intensive and complex and thus significantly added to the cost of the integrated circuit package.

Typically, each trace was aligned with the specific bond pad on the integrated circuit to which the trace was to be connected. The bond pads on the integrated circuit were connected to the traces in the same order that the bond pads were position on the integrated circuit. However, in certain instances, it was desirable to allow for cross-over connections between the bond pads and the traces. Generally, a cross-over connection is a connection between a bond pad and a trace which is not directly aligned with the bond pad.

Gow, 3Rd. et al., U.S. Pat. No. 5,168,368, which is herein incorporated by reference in its entirety, teaches a bridge which was bonded to a first set of fingers of a lead frame. The bridge was located between the integrated circuit and a second set of fingers. To form a cross-over connection, a bond wire extending between a bond pad and a finger of the second set of fingers was intermediately bonded to the bridge above the first set of fingers. In this manner, the bond wire was crossed over fingers of the first set of fingers. However, providing and attaching such a bridge was relatively labor-intensive and complex and thus significantly added to the cost of the integrated circuit package.

Thus, in both Rostoker and Gow, 3Rd. et al., an intermediate bonding structure was provided between the bond pads and traces (fingers) to reduce the unsupported length of the bond wires and thus avoid wire sweep. However, the intermediate bonding structures had to be fabricated separately and attached to the package during assembly which, as set forth above, was relatively labor-intensive and complex and thus significantly added to the cost of integrated circuit package.

SUMMARY OF THE INVENTION

In accordance with the present invention, a plastic encapsulated integrated circuit package having a large number of traces is presented. To allow the required large number of traces to be formed, the traces are spaced a significant distance from the integrated circuit. Bond pads of the integrated circuit are electrically connected to corresponding traces by corresponding long wires. Of importance, the long wires are not susceptible to wire sweep during the plastic encapsulation transfer molding process used to form the package body.

The long wires are intermediately bonded to intermediate bonding pads between the integrated circuit and the traces. Of importance, the distance between the bond pads of the integrated circuit and the intermediate bonding pads is sufficiently small such that looped portions of the long wires, which extend between the bond pads of the integrated circuit and the intermediate bonding pads, are not susceptible to wire sweep.

Of further importance, surface runner portions of the long wires, which extend between the intermediate bonding pads and the traces, extend along and contact the upper surface of the substrate and so are also not susceptible to wire sweep. More particularly, during the plastic encapsulation transfer molding process, the plastic encapsulate flows over the surface runner portions instead of around the surface runner portions. This, in turn, causes the plastic encapsulate to exert much less force on the surface runner portions than if the surface runner portions were suspended above the upper surface of the substrate.

Since the surface runner portions have much less force exerted on them during the plastic encapsulation transfer molding process, the surface runner portions can be formed of a greater length than conventional suspended bond wires.

Recall that in the prior art, the unsupported sections of the bond wires extending between the bond pads and the traces were suspended above the substrate. During the plastic encapsulation transfer molding process, the plastic encapsulate flowed around these unsupported sections of bond wires, which were susceptible to wire sweep.

For this reason, each unsupported section of bond wire had to be no greater than the maximum allowable wire bond length. Thus, even using an intermediate bonding structure of the prior art, the allowable distance between the bond pads and the traces was equal to approximate twice the maximum allowable wire bond length.

However, the distance between the bond pads and the traces needs to be greater than twice the maximum allowable wire bond length in certain instances, for example, when a large number of traces are required.

To increase the distance between the bond pads and the traces, additional intermediate bonding structures were provided. However, these additional intermediate bonding structures had to be fabricated separately and attached to the package during assembly which further added to the cost of the integrated circuit package.

Advantageously, by essentially eliminating the susceptibility of the surface runner portions to wire sweep, the distance between the bond pads and the traces can be much greater than twice the maximum allowable wire bond length. Thus, use of the long wires in accordance with the present invention is well suited for applications in which the traces are at a significant distance from the bond pads, for example, when a large number of the traces are required.

Advantageously, the intermediate bonding pads are formed during the normal processing of the substrate, e.g., during the formation of the traces. Since the intermediate bonding pads are formed during the normal processing of the substrate, there are no additional procedures or materials required for the intermediate bonding pads. Accordingly, there is essentially no cost associated with the intermediate bonding pads.

Recall that in the prior art, an intermediate bonding structure was provided between the bond pads and traces (fingers) to reduce the unsupported length of the bond wires and thus avoid wire sweep. However, the intermediate bonding structures had to be fabricated separately and attached to the package during assembly, which was relatively labor-intensive and complex, and thus significantly added to the cost of the integrated circuit package. Accordingly, the package in accordance with the present invention is fabricated at a lower cost than an integrated circuit package of the prior art.

In an alternative embodiment, a lower long wire electrically connects a first bond pad to a first trace. An upper long wire electrically connects a second bond pad to a second trace. To make the electrical connection between the second bond pad and the second trace, the upper long wire has to cross over the lower long wire. To allow the upper long wire to cross over the lower long wire, a crossover portion of the upper long wire is attached to a first jumper pad and a second jumper pad and extends over the lower long wire. In this manner, the upper long wire crosses over the lower long wire.

Alternatively, to allow the upper long wire to cross over the lower long wire, a crossover portion of the upper long wire is a trace electrically connected to the first jumper pad and the second jumper pad. This trace extends under the lower long wire. In this manner, the upper long wire extends under the lower long wire to form a crossover connection over the lower long wire.

Recall that in the prior art, a bridge was mounted above a first set of fingers. To form a crossover connection, a bond wire was extended between a bond pad and the bridge and was intermediately bonded to the bridge. The bond wire was then extended from the bridge to a finger of a second set of fingers. In this manner, the bond wire was crossed over fingers of the first set of fingers. However, providing and attaching such a bridge was relatively labor-intensive and complex and thus significantly added to the cost of the integrated circuit package.

Advantageously, the jumper pads in accordance with the present invention are formed during the normal processing of the substrate, e.g., during the formation of the traces. Since the jumper pads are formed during the normal processing of the substrate, there are no additional procedures or materials required for the jumper pads. Accordingly, there is essentially no cost associated with the jumper pads or the crossover connection of the upper long wire over the lower long wire.

In one embodiment, a plastic encapsulated integrated circuit package includes a substrate having a first surface with a die attach area and an electrically conductive trace formed thereon. An intermediate bonding pad between the die attach area and the trace is also on the first surface of the substrate.

In another embodiment, a plastic encapsulated integrated circuit package includes a substrate having a first surface with a die attach area. An electronic component has a first surface attached to the die attach area, the electronic component having a second surface. A first bond pad and a second bond pad are on the second surface of the electronic component. A first bond wire is electrically connected to the first bond pad. A first jumper pad and a second jumper pad are on the first surface of the substrate. A crossover portion extends between and electrically connects the first jumper pad and the second jumper pad. The crossover portion forms a crossover connection with respect to the first bond wire.

Also in accordance with the present invention, a method includes forming a first trace and an intermediate bonding pad on a first surface of a substrate. An electronic component is attached to the first surface of the substrate, the electronic component have a first bond pad thereon. The first bond pad is electrically connected to the first trace by a first bond wire attached to the intermediate bonding pad.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
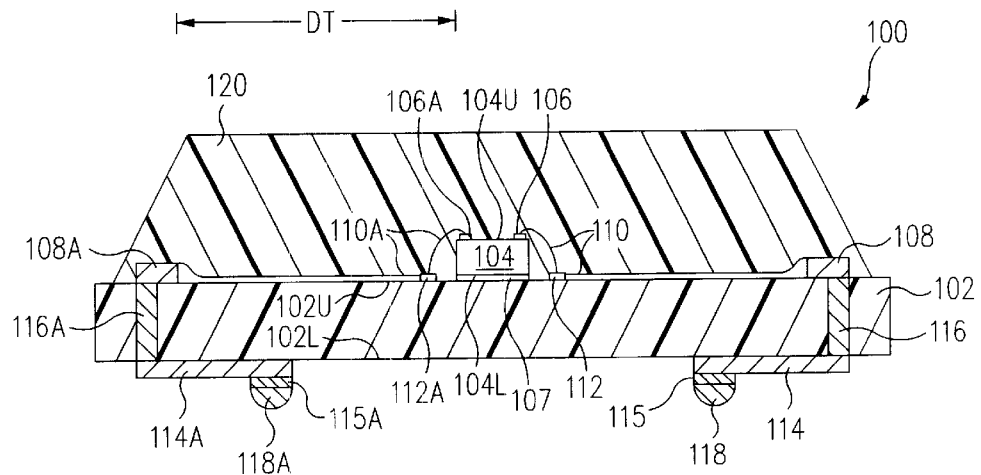
FIG. 1 is a cross-sectional view of a plastic encapsulated integrated circuit package in accordance with the present invention.

In accordance with the present invention, a plastic encapsulated integrated circuit package 100 (FIG. 1) having a large number of traces 108 is presented. To allow the required large number of traces 108 to be formed, traces 108 are spaced a significant distance DT from integrated circuit 104. Bond pads 106 of integrated circuit 104 are electrically connected to corresponding traces 108 by corresponding long wires 110. Of importance, long wires 110 are not susceptible to wire sweep during the plastic encapsulation transfer molding process used to form package body 120.

Figure 2:
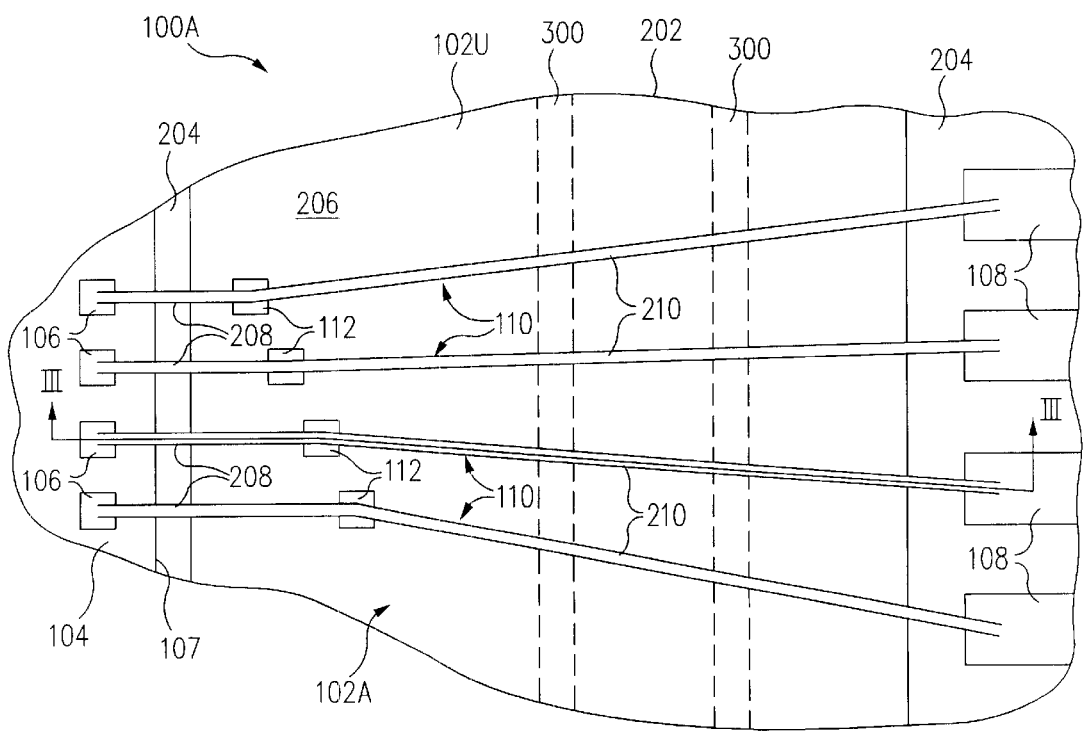
FIG. 2 is a top plan view of a portion of a package in accordance with one embodiment of the present invention.
Figure 3A:
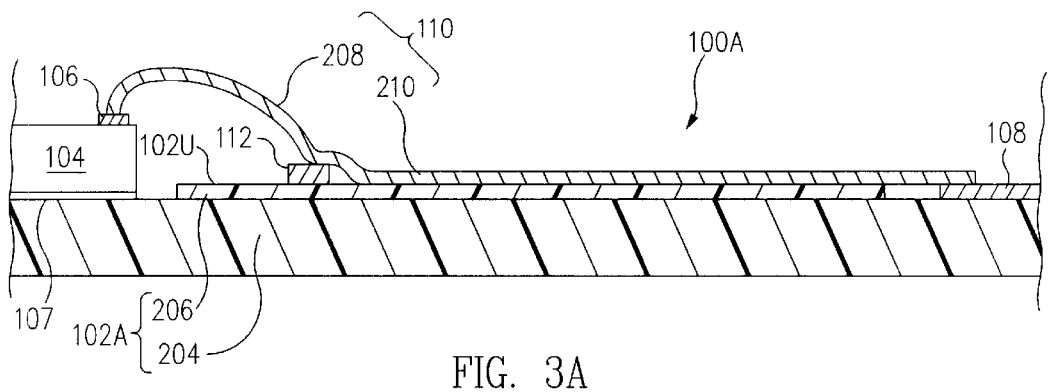
FIG. 3A is a cross-sectional view of the package along the line III—III of FIG. 2 in accordance with one embodiment of the present invention.

Referring now to FIGS. 2 and 3A, long wires 110 are intermediately bonded to intermediate bonding pads 112 laterally between integrated circuit 104 and traces 108. Of importance, the distance between bond pads 106 and intermediate bonding pads 112 is sufficiently small such that looped portions 208 of long wires 110, which extend between bond pads 106 and intermediate bonding pads 112, are not susceptible to wire sweep.

Of further importance, surface runner portions 210 of long wires 110, which extend between intermediate bonding pads 112 and traces 108, extend along and contact upper surface 102U of substrate 102 and so are also not susceptible to wire sweep. More particularly, during the plastic encapsulation transfer molding process, the plastic encapsulate flows over surface runner portions 210 instead of around surface runner portions 210. This, in turn, causes the plastic encapsulate to exert much less force on surface runner portions 210 than if surface runner portions 210 were suspended above upper surface 102U.

Since surface runner portions 210 have much less force exerted on them during the plastic encapsulation transfer molding process, surface runner portions 210 can be formed of a greater length than conventional suspended bond wires.

Recall that in the prior art, the unsupported sections of the bond wires extending between the bond pads and the traces were suspended above the substrate. During the plastic encapsulation transfer molding process, the plastic encapsulate flowed around these unsupported sections of bond wires, which were susceptible to wire sweep.

For this reason, each unsupported section of bond wire had to be no greater than the maximum allowable wire bond length. Thus, even using an intermediate bonding structure of the prior art, the allowable distance between the bond pads and the traces was equal to approximate twice the maximum allowable wire bond length. However, the distance between the bond pads and the traces needs to be greater than twice the maximum allowable wire bond length in certain instances, for example, when a large number of traces are required.

To increase the distance between the bond pads and the traces, additional intermediate bonding structures were provided. However, these additional intermediate bonding structures had to be fabricated separately and attached to the package during assembly which further added to the cost of the integrated circuit package.

Advantageously, by essentially eliminating the susceptibility of surface runner portions 210 to wire sweep, the distance between bond pads 106 and traces 108 can be much greater than twice the maximum allowable wire bond length. Thus, use of long wires 110 is well suited for applications in which traces 108 are at a significant distance from bond pads 106, for example, when a large number of traces 108 are required.

Advantageously, intermediate bonding pads 112 are formed during the normal processing of substrate 102A, e.g., during the formation of traces 108. Since intermediate bonding pads 112 are formed during the normal processing of substrate 102A, there are no additional procedures or materials required for intermediate bonding pads 112. Accordingly, there is essentially no cost associated with intermediate bonding pads 112.

Recall that in the prior art, an intermediate bonding structure was provided between the bond pads and traces (fingers) to reduce the unsupported length of the bond wires and thus avoid wire sweep. However, the intermediate bonding structures had to be fabricated separately and attached to the package during assembly, which was relatively labor-intensive and complex, and thus significantly added to the cost of the integrated circuit package. Accordingly, package 100 in accordance with the present invention is fabricated at a lower cost than an integrated circuit package of the prior art.

Figure 7:
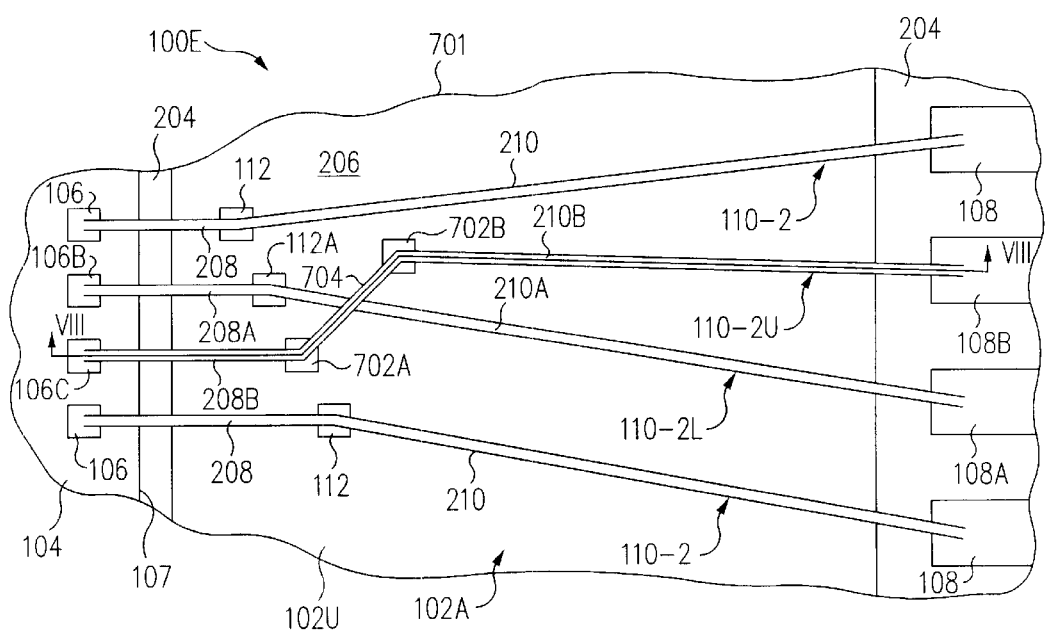
FIG. 7 is a top plan view of a portion of a package having a crossover connection in accordance with yet another embodiment of the present invention.
Figure 8A:
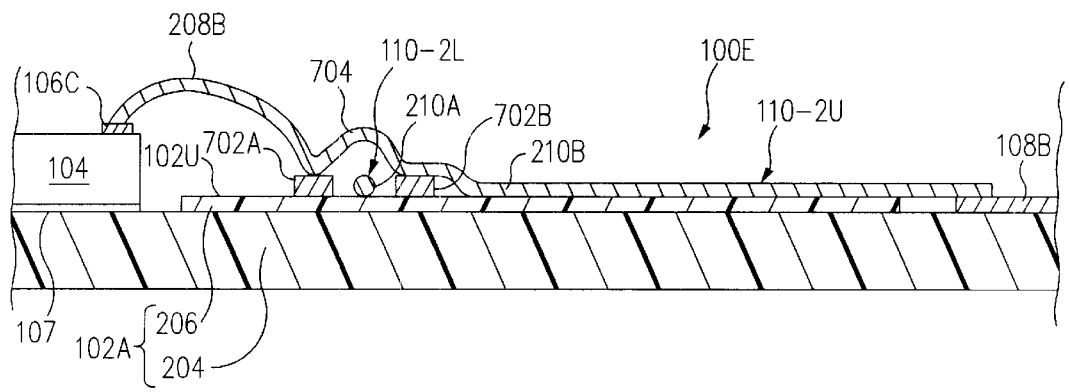
FIG. 8A is a cross-section view of the package along the line VIII—VIII of FIG. 7 in accordance with one embodiment of the present invention.

Referring now to FIGS. 7 and 8A together, in an alternative embodiment, a lower long wire 110-2L electrically connects a bond pad 106B to a trace 108A. A crossover portion 704 of an upper long wire 110-2U is attached to a first jumper pad 702A and a second jumper pad 702B and extends over lower long wire 110-2L. Alternatively, crossover portion 704A (FIG. 8B) is a trace extending under lower long wire 110-2L and electrically connecting first jumper pad 702A to second jumper pad 702B. In this manner, upper long wire 110-2U crosses over lower long wire 110-2L.

Recall that in the prior art, a bridge was mounted above a first set of fingers. To form a crossover connection, a bond wire was extended between a bond pad and the bridge and was intermediately bonded to the bridge. The bond wire was then extended from the bridge to a finger of a second set of fingers. In this manner, the bond wire was crossed over fingers of the first set of fingers. However, providing and attaching such a bridge was relatively labor-intensive and complex and thus significantly added to the cost of the integrated circuit package.

Advantageously, jumper pads 702A, 702B (and crossover portion 704A in the FIG. 8B embodiment) are formed during the normal processing of substrate 102A, e.g., during the formation of traces 108. Since jumper pads 702A, 702B are formed during the normal processing of substrate 102A, there are no additional procedures or materials required for jumper pads 702A, 702B. Accordingly, there is essentially no cost associated with jumper pads 702A, 702B or the crossover connection of upper long wire 110-2U over lower long wire 110-2L.

More particularly, FIG. 1 is a cross-sectional view of a plastic encapsulated integrated circuit package 100 in accordance with the present invention. Package 100 includes a substrate 102 having an upper, e.g., first, surface 102U. A lower, e.g., first, surface 104L of an integrated circuit 104 is attached to a die attach area 107 of upper surface 102U, for example, with adhesive. A plurality of bond pads 106 are on an upper, e.g., second, surface 104U of integrated circuit 104. Although integrated circuit 104 is set forth, in light of this disclosure, it is understood that integrated circuit 104 can be replaced with other electronic components.

Formed on upper surface 102U of substrate 102 are a plurality of electrically conductive traces 108. To allow the required large number of traces 108 to be formed on upper surface 102U, traces 108 are spaced at a significant distance DT from integrated circuit 104, e.g., 0.50 to 0.80 inches (12.7 to 20.3 millimeters). Illustratively, 64 to 200 traces 108 are formed on upper surface 102U, traces 108 having a 100 micrometer (μm) width and a 100 82 m spacing from one another, i.e., traces 108 have a 200 μm center to center pitch.

Bond pads 106 are electrically connected to corresponding traces 108 by bond wires 110 (hereinafter referred to as long wires 110). As discussed further below, long wires 110 extend from corresponding bond pads 106 to corresponding intermediate bonding pads 112 on upper surface 102U of substrate 102. Long wires 110 extend from intermediate bonding pads 112 along upper surface 102U of substrate 102 to corresponding traces 108.

Traces 108 are electrically connected to corresponding traces 114 on a lower, e.g., second, surface 102L of substrate 102 by corresponding electrically conductive vias 116 extending through substrate 102. Formed on traces 114 are corresponding electrically conductive pads 115. Formed on pads 115 are corresponding electrically conductive interconnection balls 118, e.g., solder balls. Interconnection balls 118 form the electrical interconnections between package 100 and the larger substrate (not shown) such as a printed circuit mother board.

To illustrate, a first bond pad 106A of the plurality of bond pads 106 is electrically connected to a first trace 108A of the plurality of traces 108 by a first long wire 110A of the plurality of long wires 110. Trace 108A is electrically connected to a first trace 114A of the plurality of traces 114 by a first via 116A of the plurality of vias 116. A first pad 115A of the plurality of pads 115 is formed on trace 114A. A first interconnection ball 118A of the plurality of interconnection balls 118 is formed on first pad 115A. The other bond pads 106, long wires 110, traces 108, vias 116, traces 114, pads 115, and interconnection balls 118 are electrically connected to one another in a similar manner and so are not discussed further.

Although a particular electrically conductive pathway between bond pad 106A and interconnection ball 118A is set forth, those of skill in the art will recognize that other electrically conductive pathways can be formed. For example, substrate 102 is a multi-layered laminate substrate and, instead of straight through vias 116, a plurality of electrically conductive traces on various layers in substrate 102 are interconnected by a plurality of electrically conductive vias to form the electrical interconnections between traces 108 and 114. As a further example, interconnection balls 118 are distributed in an array format to form a ball grid array (BGA) type package. Alternatively, interconnection balls 118 are not formed, e.g., to form a metal land grid array (LGA) type package or a leadless chip carrier (LCC) type package. Other electrically conductive pathway modifications will be obvious to those of skill in the art.

Supported by and formed on upper surface 102U of substrate 102 is a package body 120. Package body 120 is formed using a plastic encapsulation transfer or injection molding process wherein package 100 is inserted into a mold and covered with plastic encapsulate, which is transferred (injected) into the mold. Alternatively, package body 120 is formed using a liquid encapsulation process wherein package 100 is covered with a liquid encapsulate, which is cured. Plastic encapsulation transfer molding processes, plastic encapsulation injection molding processes and liquid encapsulation processes are well known to those of skill in the art and are not discussed further to avoid detracting from the principals of the invention. For simplicity of discussion, a plastic encapsulation transfer molding process is hereinafter discussed, however, in light of this disclosure, it is understood that a plastic encapsulation injection molding process or a liquid encapsulation process could equally be used.

Package body 120 encloses integrated circuit 104, bond pads 106, long wires 110, intermediate bonding pads 112, and traces 108. Of importance, long wires 110 are not subject to wire sweep during the plastic encapsulation transfer molding process used to form package body 120 as discussed in greater detail below with reference to FIGS. 2 and 3A.

FIG. 2 is a top plan view of a portion 202 of a package 100A in accordance with one embodiment of the present invention. FIG. 3A is a cross-sectional view of package 100A along the line III—III of FIG. 2 in accordance with one embodiment of the present invention. In the figures which follow, package body 120 (FIG. 1) is not illustrated for purposes of clarity.

Referring to FIGS. 2 and 3A, in this embodiment, a substrate 102A is a multi-layer substrate, which includes a principal substrate 204 and an electrically insulating layer 206 formed on principal substrate 204. Insulating layer 206 electrically isolates principal substrate 204 including any electrically conductive structures of principal substrate 204 from long wires 110.

Insulating layer 206 defines an upper surface 102U of substrate 102A. For example, principal substrate 204 is a printed circuit board or ceramic type substrate and insulating layer 206 is a solder mask. Insulating layer 206 is formed on principal substrate 204 laterally between integrated circuit 104 and traces 108. However, in an alternative embodiment, insulating layer 206 entirely covers principal substrate 204 and, in particular, extends underneath integrated circuit 104 and traces 108. In yet another alternative embodiment, insulating layer 206 is not formed.

Formed on upper surface 102U of substrate 102A, and more particularly on or through insulating layer 206, are a plurality of intermediate bonding pads 112. Intermediate bonding pads 112 are formed adjacent to die attach area 107 of upper surface 102U of substrate 102A and, more particularly, are formed on upper surface 102U of substrate 102A laterally between die attach area 107 and traces 108.

Intermediate bonding pads 112 are formed of a material suitable for forming a wire bond connection thereto. For example, intermediate bonding pads 112 include a metal and, in one particular embodiment, intermediate bonding pads 112 are formed of the same metal or other electrically conductive material of which traces 108 are formed of. Of importance, before formation of long wires 110, intermediate bonding pads 112 are electrically isolated from one another and, more generally, from any electrically conductive structure of package 100. Stated another way, intermediate bonding pads 112 are electrically floating.

Long wires 110 include first portions 208, hereinafter looped portions 208, and second portions 210, hereinafter surface runner portions 210. Looped portions 208 extend between bond pads 106 and intermediate bonding pads 112. As an example, the distance between a bond pad 106 and a corresponding intermediate bonding pad 112 is in the range of 0.10 to 0.20 inches (2.54 to 5.08 mm) and preferably is less than 0.050 inches (1.27 mm). Looped portions 208 are looped with an arc typical of conventional wire bonds.

Surface runner portions 210 extend between intermediate bonding pads 112 and traces 108. Surface runner portions 210 extend along and contact upper surface 102U.

As discussed in greater detail below with reference to FIGS. 4A and 4B, each long wire 110 includes a first wire, which forms looped portion 208, and a second wire, which forms surface runner portion 210. Alternatively, as discussed in greater detail below with reference to FIG. 5, each long wire 110 is a single wire, which forms both looped portion 208 and surface runner portion 210.

Figure 4A:
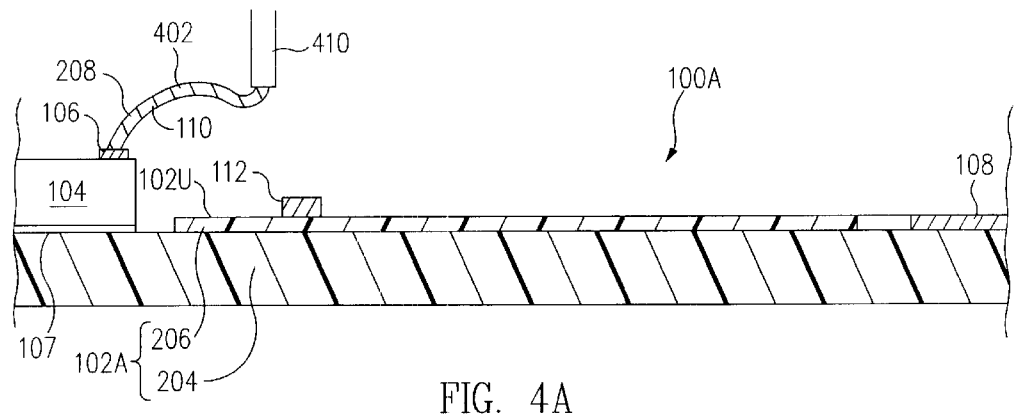
FIG. 4A is a cross-sectional view of the package of FIGS. 2 and 3A during fabrication in accordance with one embodiment of the present invention.

FIG. 4A is a cross-sectional view of package 100A of FIGS. 2 and 3A during fabrication in accordance with one embodiment of the present invention. Referring to FIG. 4A, to fabricate package 100A, substrate 102A is formed. To illustrate, insulating layer 206 is formed on principal substrate 204 in a conventional manner. Traces 108 and intermediate bonding pads 112 are formed on substrate 102A. For example, intermediate bonding pads 112 are formed at the same time and during the same processing used to form traces 108. Generally, an electrically conductive layer is formed and selectively patterned, or, an electrically conductive layer is selectively formed, to form intermediate bonding pads 112 and traces 108, as those of skill in the art will understand.

To illustrate, the electrically conductive layer is formed by plating or screening an electrically conductive material on principal substrate 204. As an example, principal substrate 204 is a printed circuit board type substrate and traces 108/intermediate bonding pads 112 are multilayered metallizations such as: (1) copper; (2) nickel on the copper; and (3) gold on the nickel. As an alternative example, principal substrate 204 is a ceramic type substrate and traces 108/intermediate bonding pads 112 are: (1) tungsten; (2) nickel on the tungsten; and (3) gold on the nickel.

Advantageously, intermediate bonding pads 112 are formed during the normal processing of substrate 102A, e.g., during the formation of traces 108. Since intermediate bonding pads 112 are formed during the normal processing of substrate 102A, there are no additional procedures or materials required for intermediate bonding pads 112. Accordingly, there is essentially no cost associated with intermediate bonding pads 112.

Recall that in the prior art, an intermediate bonding structure was provided between the bond pads and traces (fingers) to reduce the unsupported length of the bond wires and thus avoid wire sweep. However, the intermediate bonding structures had to be fabricated separately and attached to the package during assembly, which was relatively labor-intensive and complex, and thus significantly added to the cost of the integrated circuit package. Accordingly, package 100 in accordance with the present invention is fabricated at a lower cost than an integrated circuit package of the prior art.

After substrate 102A, traces 108, and intermediate bonding pads 112 are fabricated, integrated circuit 104 is attached to substrate 102A in a conventional manner such as with adhesive.

Bond pads 106 are wire bonded to traces 108 by long wires 110. To form each long wire 110, a conventional wire bonder 410 bonds a first wire 402 to a bond pad 106. An example of a suitable wirebonder 410 includes a KNS-1488 Turbo wirebonder manufactured by Kulick & Soffa Industries, Inc., 2101 Blair Mill Road, Willow Grove, Pa. 19090. In one embodiment, a gold or aluminum wire having a diameter in the approximate range of 0.001 inches (0.025 mm) to 0.0013 inches (0.033 mm) is used. First wire 402 is bonded to bond pad 106 and is stretched, i.e., extended from bond pad 106 to intermediate bonding pad 112 to form looped portion 208 of long wire 110. First wire 402 is attached to intermediate bonding pad 112 using a conventional wire bonding technique such as an ultrasonic or thermosonic bonding technique.

First wire 402 is terminated, i.e., cut, at intermediate bonding pad 112. FIG. 4B is a cross-sectional view of package 100A of FIG. 4A at a later stage of fabrication. Referring now to FIG. 4B, a new second wire 404 is attached to intermediate bonding pad 112. Preferable, second wire 404 is attached to intermediate bonding pad 112 directly on top of first wire 402 as illustrated in FIG. 4B. In this manner, the bond between looped portion 208 of long wire 110 and intermediate bonding pad 112 is reinforced.

Second wire 404 is stretched flat along upper surface 102U of substrate 102A to trace 108 to form surface runner portion 210 of long wire 110. Second wire 404 is bonded to trace 108 using a conventional wire bonding technique.

Figure 5:
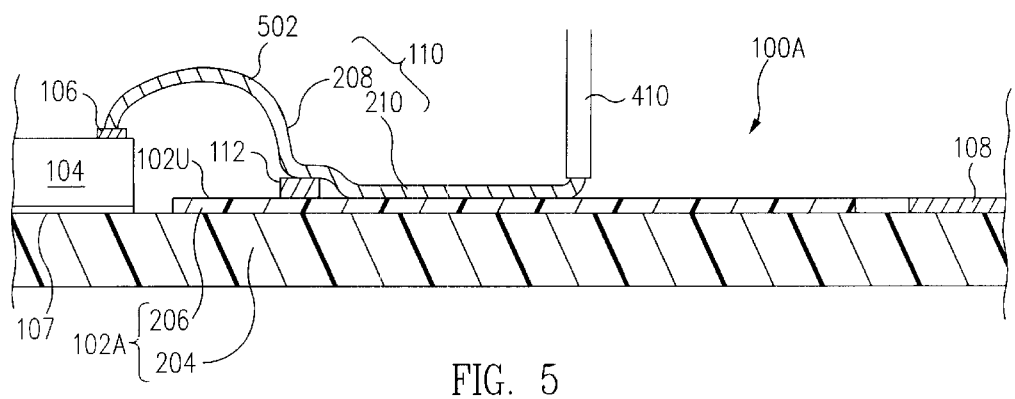
FIG. 5 is a cross-sectional view of the package of FIGS. 2 and 3A during fabrication in accordance with another embodiment of the present invention.

However, in an alternative embodiment, a single wire forms both looped portion 208 and surface runner portion 210 of long wire 110, i.e., long wire is integral and, more particularly, is a single wire and not a plurality of separate wires connected together. FIG. 5 is a cross-sectional view of package 101A of FIGS. 2 and 3A during fabrication in accordance with this alternative embodiment of the present invention. In this embodiment, a wire 502 is bonded to a bond pad 106 and is stretched to intermediate bonding pad 112. Wire 502 is stitched to intermediate bonding pad 112 by wire bonder 410. Generally, stitching involves bonding wire 502 to intermediate bonding pad 112 without cutting wire 502.

Wire 502 is stretched flat along upper surface 102U of substrate 102A from intermediate bonding pad 112 to trace 108 to form surface runner portion 210 of long wire 110. More particularly, wire 502 is stretched flat along insulating layer 206. Wire 502 is then bonded to and terminated at trace 108 using a conventional wire bonding technique.

Figure 4B:
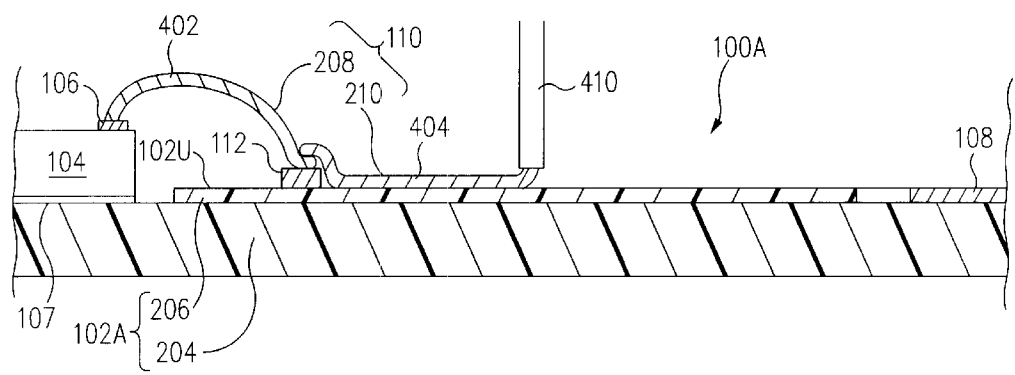
FIG. 4B is a cross-sectional view of the package of FIG. 4A at a later stage of fabrication.

Advantageously, long wires 110 are formed using standard packaging equipment, i.e., standard wire bonders such as wire bonder 410 of FIGS. 4A, 4B and 5. By using standard packaging equipment, large tooling, capital equipment, and training costs, which would otherwise be incurred with nonstandard packaging equipment, are avoided.

In some instances, minor modifications to the standard wire bonder may be necessary. For example, wire bonder software may have to be modified to allow stitching (instead of termination) of wires 502 (FIG. 5) to intermediate bonding pads 112, and to form surface runner portions 210 of long wires 110 so that they lay flat on upper surface 102U of substrate 102A (instead of being looped). However, such modifications are minor and it is well within the skill of those skilled in the art of wire bonding to make such modifications.

To finalize assembly of package 100A, referring again to FIGS. 2 and 3A, package 100A is encapsulated in plastic encapsulate to form package body 120 using a conventional encapsulation process. (Package body 120 is illustrated in FIG. 1). More particularly, integrated circuit 104, bond pads 106, long wires 110, intermediate bonding pads 112, and traces 108 are encapsulated in plastic encapsulate to form packing body 110.

Of importance, the distance between bond pads 106 and intermediate bonding pads 112 is sufficiently small such that looped portions 208 are not susceptible to wire sweep during the plastic encapsulation transfer molding process. For example, the distance between bond pads 106 and intermediate bonding pads 112 is less than 0.20 inches (5.08 millimeters) and, in one particular embodiment, is within the range of 0.10 inches (2.54 millimeters) to 0.20 inches (5.08 millimeters) and preferably is 0.050 inches (1.27 mm) or less.

Further, since surface runner portions 210 extend along upper surface 102U, surface runner portions 210 are not susceptible to wire sweep. More particularly, during the plastic encapsulation transfer molding process, the plastic encapsulate flows over surface runner portions 210 instead of around surface runner portions 210. This, in turn, causes the plastic encapsulate to exert much less force on surface runner portions 210 than if surface runner portions 210 were suspended above upper surface 102U.

Since surface runner portions 210 have much less force exerted on them during the plastic encapsulation transfer molding process, surface runner portions 210 can be formed of a greater length than conventional suspended bond wires. For example, the length of surface runner portions 210, i.e., the distance between intermediate bonding pads 112 and traces 108, is as great as 0.70 inches (17.78 millimeters) and, in one embodiment, is within the approximate range of 0.50 inches to 0.70 inches (12.70 millimeters to 17.78 millimeters) although surface runner portions 210 are formed to have other lengths in other embodiments.

Recall that in the prior art, the unsupported sections of the bond wires extending between the bond pads and the traces were suspended above the substrate. During the plastic encapsulation transfer molding process, the plastic encapsulate flowed around these unsupported sections of bond wires, which were susceptible to wire sweep.

For this reason, each unsupported section of bond wire had to be no greater than the maximum allowable wire bond length, e.g., had to be less than or equal to 0.25 inches (6.35 millimeters) and preferably 0.050 inches (1.27 mm) or less. Thus, even using an intermediate bonding structure of the prior art, the allowable distance between the bond pads and the traces was equal to approximate twice the maximum allowable wire bond length. However, the distance between the bond pads and the traces needs to be greater than twice the maximum allowable wire bond length in certain instances, for example, when a large number of traces are required.

To increase the distance between the bond pads and the traces, additional intermediate bonding structures were provided. However, these additional intermediate bonding structures had to be fabricated separately and attached to the package during assembly which further added to the cost of the integrated circuit package.

Advantageously, by essentially eliminating the susceptibility of surface runner portions 210 to wire sweep, the distance between bond pads 106 and traces 108 can be much greater than twice the maximum allowable wire bond length. Further, this long distance between bond pads 106 and traces 108 is realized without expending additional labor and/or adding complexity to the fabrication process. Thus, use of long wires 110 is well suited for applications in which traces 108 are at a significant distance from bond pads 106, for example, when a large number traces 108 are required.

Figure 3B:
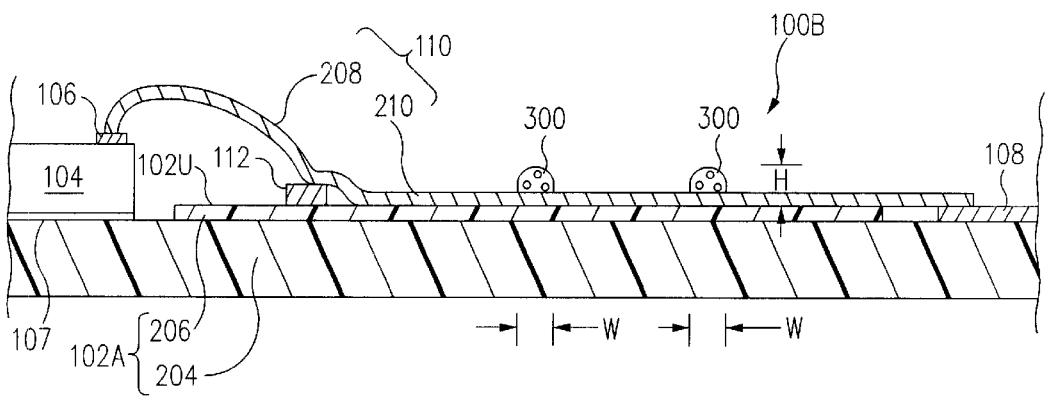
FIG. 3B is a cross-sectional view of a package along the line III—III of FIG. 2 in accordance with an alternative embodiment of the present invention.

When the length of surface runner portion 210 of long wire 110 becomes extremely long, e.g., 0.300 inches (7.60 millimeters) or greater, it may be advisable to attach surface runner portion 210 to upper surface 102U of substrate 102A. FIG. 3B is a cross-sectional view of a package 100B along the line III—III of FIG. 2 illustrating the anchoring of surface runner portion 210 to upper surface 102U in accordance with an alternative embodiment of the present invention.

Referring to FIGS. 2 and 3B together, after long wires 110 are formed and before plastic encapsulation, beads 300 of adhesive (hereinafter adhesive beads 300) such as epoxy are dispensed over surface runner portions 210 of long wires 110. (Adhesive beads 300 are illustrated in dashed lines in FIG. 2 for purposes of clarity.) For example, Hysol 4323 is dispensed to form adhesive beads 300 using an adhesive dispensing machine such as a Camelot 5000 dispensing machine from Camelot Systems, Inc. of Massachusetts. Any one of a number of adhesive dispensing machines can be used and the particular adhesive dispensing machine used is not essential to the invention. After dispensing, adhesive beads 300 are cured in a conventional manner.

Generally, at least one adhesive bead 300 is formed, e.g., two adhesive beads 300 are formed. In one embodiment, height H of each adhesive bead 300 above upper surface 102U of substrate 102A is within the approximate range of 0.005 inches (0.127 millimeters) to 0.010 inches (0.254 millimeters) and width W of each adhesive bead 300 is within the approximate range of 0.010 inches (0.254 millimeters) to 0.020 inches (0.508 millimeters).

Surface runner portions 210 of long wires 110 extend through and are attached to adhesive beads 300. Adhesive beads 300 are also attached to upper surface 102U of substrate 102A. In this manner, surface runner portions 210 are attached to, sometimes called anchored, to upper surface 102U of substrate 102A. By anchoring surface runner portions 210 to upper surface 102U of substrate 102A, any possibility of wire sweep of surface runner portions 210 is eliminated.

To finalize assembly of package loop, package 100B is encapsulated in plastic encapsulate to form package body 120 using a conventional plastic encapsulation transfer molding process. (Package body 120 is illustrated in FIG. 1).

Figure 3C:
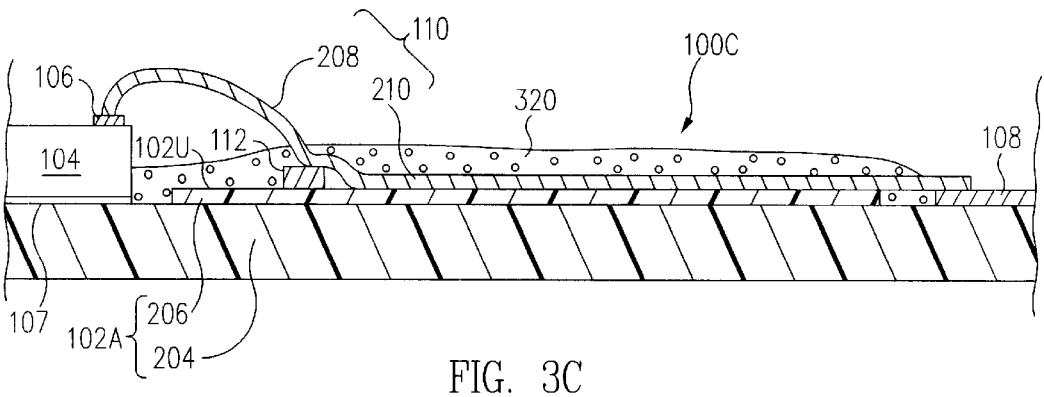
FIG. 3C is a cross-sectional view of a package along the line III—III of FIG. 2 in accordance with yet another alternative embodiment of the present invention.

FIG. 3C is a cross-sectional view of a package 100C along the line III—III of FIG. 2 illustrating the anchoring of surface runner portions 210 to upper surface 102U in accordance with yet another alternative embodiment of the present invention. In this embodiment, after long wires 110 are formed and before plastic encapsulation, a sealing layer 320 is applied over surface runner portions 210 of long wires 110. In one embodiment, sealing layer 320 is any one of the number of conventional epoxy underfills, for example is Nagase 3002 epoxy underfill of Shinetsu 5123 epoxy underfill. After application, sealing layer 320 is cured.

Figure 6:
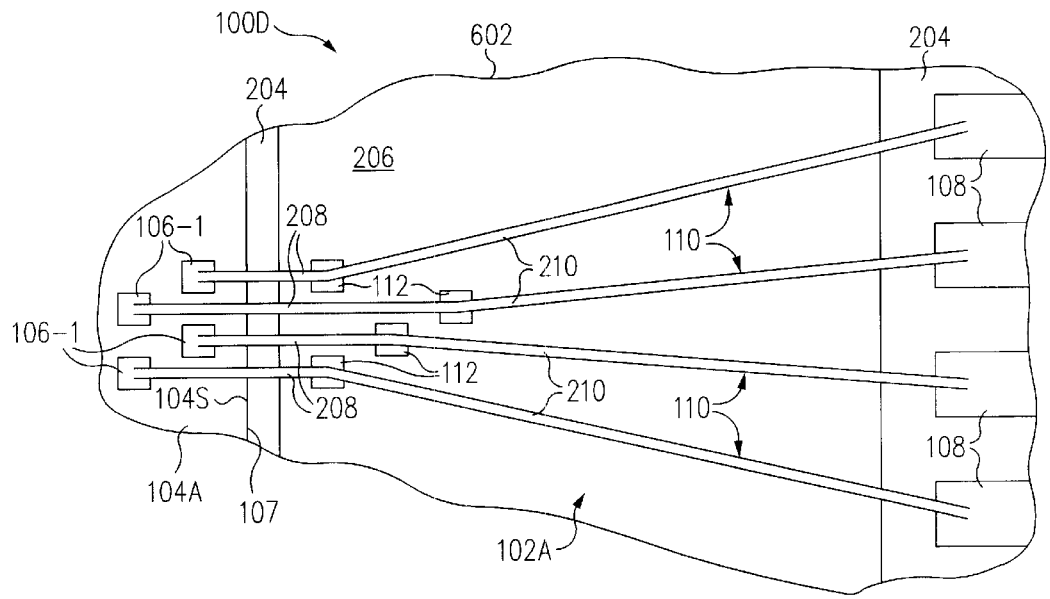
FIG. 6 is a top plan view of a portion of a package in accordance with another embodiment of the present invention.

In one embodiment, sealing layer 320 completely encloses surface runner portions 210 of long wires 110 and intermediate bonding pads 112. By encasing surface runner portions 210 within sealing layer 320, any possibility of wire sweep of surface runner portions 210 is eliminated. To finalize assembly of package 100C, package 100C is encapsulated in plastic encapsulate to form package body 120 using a conventional encapsulation process. (Package body 120 is illustrated in FIG. 1.) FIG. 6 is a top plan view of a portion 602 of a package 100D in accordance with another embodiment of the present invention. Package 100D of FIG. 6 is substantially similar to package 100A of FIG. 3A and only the relevant differences between packages 100D and 100A are discussed below.

Referring to FIG. 6, in this embodiment, bond pads 106-1 are staggered, i.e., are not formed directly side by side. By staggering bond pads 106-1, the number of bond pads 106-1 which can be formed within any unit length along a side 104S of integrated circuit 104A is increased compared to having bond pads directly side by side (see bond pads 106 of FIG. 2 for an example of a side-by-side arrangement of bond pads). Stated another way, by staggering bond pads 106-1, the pitch of bond pads 106-1 is minimized.

Advantageously, since long wires 110 are not susceptible to wire sweep, long wires 110 are well suited for use with extremely small pitch, e.g., 0.002 inches (0.050 mm), bond pads such as bond pads 106-1. To illustrate, in one particular embodiment, long wires 110 have a diameter of 25 micrometers ($\mu$m) and are spaced apart from one another by 36 $\mu$m to have a center to center pitch of 61 $\mu$m. To avoid interference, e.g., parasitic capacitance, between long wires 110 when the pitch becomes relatively small, intermediate bonding pads 112 are staggered as shown in FIG. 6.

FIG. 7 is a top plan view of a portion 701 of a package 100E having a crossover connection in accordance with one embodiment of the present invention. FIG. 8A is a cross-section view along the line VIII—VIII of FIG. 7. Referring to FIGS. 7 and 8A together, a first long wire 110-2U (hereinafter upper long wire 110-2U) of a plurality of long wires 110-2 crosses over a second long wire 110-2L (hereinafter lower long wire 110-2L) of the plurality of long wires 110-2.

Lower long wire 110-2L includes a looped portion 208A and a surface runner portion 210A. Lower long wire 110-2L is formed in a manner similar to that described above with reference to long wires 110, e.g., see FIGS. 4A, 4B and 5. More particularly, lower long wire 110-2L extends from a first bond pad 106B of the plurality of bond pads 106 to an intermediate bonding pad 112A of the plurality of intermediate bonding pads 112. Lower long wire 110-2L extends from intermediate bonding pads 112A along upper surface 102U of substrate 102A to a first trace 108A of the plurality of traces 108.

Formed on upper surface 102U of substrate 102A is a first jumper pad 702A and a second jumper pad 702B (collectively jumper pads 702). Illustratively, jumper pads 702 are formed at the same time, and during the same process, that intermediate bonding pads 112 are formed. Further, jumper pads 702 are essentially the same, or are the same, as intermediate bonding pads 112.

After lower long wire 110-2L is formed, upper long wire 110-2U is formed. Upper long wire 110-2U extends from a second bond pad 106C of the plurality of bond pads 106 to first jumper pad 702A. Upper long wire 110-2U extends from first jumper pad 702A to second jumper pad 702B over lower long wire 110-2L. Upper long wire 110-2U extends from second jumper pad 702B along upper surface 102U of substrate 102A to a second trace 108B of the plurality of traces 108.

To form upper long wire 110-2U, a conventional wire bonder bonds a first wire to bond pad 106C. The first wire is stretched in a loop from bond pad 106C to jumper pad 702A to form a looped portion 208B of upper long wire 110-2U in a manner similar to that illustrated in FIG. 4A. The first wire is attached to jumper pad 702A.

The first wire is then terminated at jumper pad 702A. A new second wire is then attached to jumper pad 702A. Preferable, this second wire is attached to jumper pad 702A directly on top of looped portion 208B of upper long wire 110-2U in a manner similar to that illustrated in FIG. 4B. This reinforces the bond between looped portion 208B of upper long wire 110-2U and jumper pad 702A.

The second wire is stretched in a loop from jumper pad 702A to jumper pad 702B to form a crossover portion 704 of upper long wire 110-2U. The second wire is bonded to and terminated at jumper pad 702B.

As shown in FIG. 8A, crossover portion 704 is looped, sometimes called arched, over surface runner portion 210A of lower long wire 110-2L. Of importance, the distance between jumper pad 702A and jumper pad 702B is no greater than the maximum allowable distance for a wire bond. Consequently, crossover portion 704 is not susceptible to wire sweep and there is essentially no possibility that crossover portion 704 will come into contact with lower long wire 110-2L.

A new third wire is then attached to jumper pad 702B. Preferable, this third wire is attached to jumper pad 702B directly on top of crossover portion 704 in a manner similar to that illustrated in FIG. 4B. This reinforces the bond between crossover portion 704 of upper long wire 110-2U and jumper pad 7029.

The third wire is then stretched flat along upper surface 102U of substrate 102A to trace 108B to form surface runner portion 210B of upper long wire 110-2U. The third wire is bonded to and terminated at trace 105B. Since surface runner portion 2102 of upper long wire 110-2U extends along upper surface 102U, surface runner portion 210B is not susceptible to wire sweep. Accordingly, surface runner portion 210B can be formed of a greater length than conventional suspended bond wires.

In an alternative embodiment, instead of terminating the first wire at jumper pad 702A and terminating the second wire at jumper pad 702B and stretching a third wire between jumper pad 702B and trace 108 as described above, the first wire is stitched to jumper pad 702A and is stitched to jumper pad 702B in a manner similar to that illustrated in FIG. 5. The first wire is stretched to trace 108B, where it is bonded and terminated.

Recall that in the prior art, a bridge was mounted above a first set of fingers. To form a crossover connection, a bond wire was extended between a bond pad and the bridge and was intermediately bonded to the bridge. The bond wire was then extended from the bridge to a finger of a second set of fingers. In this manner, the bond wire was crossed over fingers of the first set of fingers. However, providing and attaching such a bridge was relatively labor-intensive and complex and thus significantly added to the cost of the integrated circuit package.

Advantageously, jumper pads 702 are formed during the normal processing of substrate 102A, e.g., during the formation of traces 108. Since jumper pads 702 are formed during the normal processing of substrate 102A, there are no additional procedures or materials required for jumper pad 702. Accordingly, there is essentially no cost associated with jumper pads 702.

Further, long wires 110-2, including upper and lower long wires 110-2U, 110-2L are formed using standard packaging equipment, i.e., standard wire bonders. By using standard packaging equipment, large tooling, capital equipment, and training costs, which would otherwise be incurred with nonstandard packaging equipment, are avoided. As a result, package 100E is fabricated at a lower cost than a prior art package having a crossover connection. Although upper long wire 110-2U crosses over a single long wire 110, i.e., over lower long wire 110-2L, in light of this disclosure, those of skill in the art will understand that upper long wire 110-2U crosses over more than one long wire 110, i.e., over a plurality of long wires 110, in other embodiments.

Figure 8B:
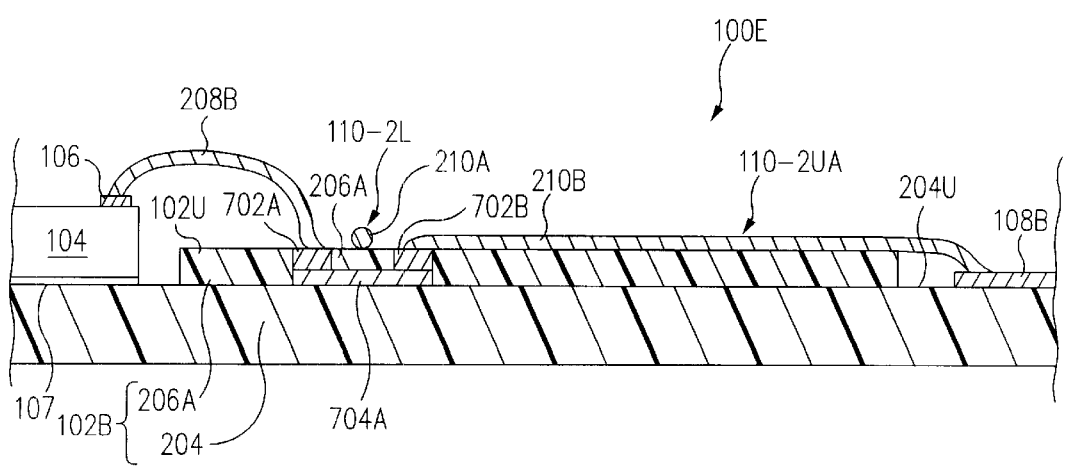
FIG. 8B is a cross-section view of the package along the line VIII—VIII of FIG. 7 in accordance with another embodiment of the present invention.

FIG. 8B is a cross-section view of package 100E along the line VIII—VIII of FIG. 7 in accordance with another embodiment of the present invention. The embodiment of FIG. 8B is substantially similar to the embodiment of FIG. 8A and only the relevant differences are discussed below.

Referring now to FIG. 8B, upper long wire 110-2UA includes looped portion 208B, a crossover portion 704A, and surface runner portion 210B. In accordance with this embodiment, crossover portion 704A is an electrically conductive trace on an upper surface 204U of principal substrate 204. Crossover portion 704A electrically connects jumper pad 702A to jumper pad 702B, which are formed on crossover portion 704A. Illustratively, crossover portion 704A is formed during the normal processing of substrate 102B, e.g., during the formation of traces 108.

Insulating layer 206A covers crossover portion 704A between jumper pad 702A and jumper pad 702B. By covering crossover portion 704A, insulating layer 206A is located between crossover portion 704A and lower long wire 110-2L and thus electrically isolates crossover portion 704A from lower long wire 110-2L. More particularly, crossover portion 704A passes under lower long wire 110-2L, which rests on insulating layer 206A.

Although crossover portion 704A passes under lower long wire 110-2L, upper long wire 110-2UA is said to cross over lower long wire 110-2L. Further, although upper long wire 110-2UA crosses over a single long wire 110, i.e., over lower long wire 110-2L, in light of this disclosure, those of skill in the art will understand that upper long wire 110-2UA crosses over more than one long wire 110, i.e., over a plurality of long wires 110, in other embodiments.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

I claim:

1. A structure comprising:
    a substrate comprising:
        a first surface, said first surface having a die attach area;
        a principal substrate; and
        an insulating layer on said principal substrate;
        an electrically conductive first trace on said first surface; and
        an intermediate bonding pad on said first surface, said intermediate bonding pad being between said die attach area and said first trace, said intermediate bonding pad being formed on or through said insulating layer.

2. The structure of claim 1 wherein said principal substrate is a printed circuit board and wherein said insulating layer is a solder mask.

3. A structure comprising:
    a substrate having a first surface, said first surface having a die attach area;
    an electrically conductive first trace on said first surface;
    an intermediate bonding pad on said first surface, said intermediate bonding pad being between said die attach area and said first trace;
    an electronic component having a first surface attached to said die attach area, said electronic component having a second surface, a first bond pad being on said second surface; and
    a first bond wire extending from said first bond pad to said intermediate bonding pad and from said intermediate bonding pad to said first trace.

4. The structure of claim 3 wherein said intermediate bonding pad is adjacent to said die attach area.

5. The structure of claim 3 wherein said intermediate bonding pad is an electrically conductive material and is electrically floating.

6. The structure of claim 3 wherein said first trace is formed of an electrically conductive material, said intermediate bonding pad being formed of said electrically conductive material.

7. The structure of claim 3 wherein said first bond wire comprises a first portion extending between said first bond pad and said intermediate bonding pad.

8. The structure of claim 3 wherein said first wire is stitched to said intermediate bonding pad.

9. The structure of claim 3 further comprising:
    a second bond pad on said second surface of said electronic component;
    a first jumper pad on said first surface of said substrate;
    a second jumper pad on said first surface of said substrate; and
    a second bond wire extending from said second bond pad to said first jumper pad, and from said first jumper pad to said second jumper pad over said first bond wire.

10. The structure of claim 3 further comprising:
    a second bond pad on said second surface of said electronic component;
    a first jumper pad on said first surface of said substrate;
    a second jumper pad on said first surface of said substrate;
    a second bond wire extending from said second bond pad to said first jumper pad; and
    a crossover portion extending between and electrically connecting said first jumper pad to said second jumper pad under said first bond wire.

11. The structure of claim 3 further comprising a package body on said first surface of said substrate, said package body enclosing said electronic component, said first bond pad, said first bond wire, said intermediate bonding pad, and said first trace.

12. The structure of claim 7 wherein said first portion is looped with an arc.

13. The structure of claim 7 wherein said first bond wire comprises a second portion extending between said intermediate bonding pad and said first trace.

14. The structure of claim 13 wherein said second portion extends along and contacts said first surface of said substrate.

15. The structure of claim 9 wherein said second bond wire extends from said second jumper pad to an electrically conductive second trace on said first surface of said substrate.

16. A structure comprising:
    a substrate having a first surface, said first surface having a die attach area;
    an electronic component having a first surface attached to said die attach area, said electronic component having a second surface;

a bond pad on said second surface of said electronic component;

an electrically conductive trace on said first surface of said substrate;

an intermediate bonding pad on said first surface of said substrate; and a bond wire extending from said bond pad to said intermediate bonding pad and from said intermediate bonding pad to said trace, said bond wire extending between said intermediate bonding pad and said trace along and in contact with said first surface of said substrate.

17. A structure comprising:

a substrate having a first surface, said first surface having a die attach area;

an electronic component having a first surface attached to said die attach area, said electronic component having a second surface, a first bond pad and a second bond pad being on said second surface;

a first bond wire electrically connected to said first bond pad;

a first jumper pad on said first surface of said substrate;

a second jumper pad on said first surface of said substrate; and a crossover portion extending between and electrically connecting said first jumper pad and said second jumper pad, said crossover portion forming a crossover connection with respect to said first bond wire.

18. The structure of claim 17 wherein said crossover portion comprises a second bond wire extending between said first jumper pad and said second jumper pad over said first bond wire.

19. The structure of claim 17 wherein said crossover portion is an electrically conductive second trace extending between said first jumper pad and said second jumper pad under said first bond wire.

20. The structure of claim 19 further comprising a solder mask between said second trace and said first bond wire.

* * * * *